United States Patent [19]

Freeouf et al.

[11] Patent Number: 4,638,342
[45] Date of Patent: Jan. 20, 1987

[54] SPACE CHARGE MODULATION DEVICE

[75] Inventors: John L. Freeouf, Peekskill; Thomas N. Jackson, Ossining; Steven E. Laux, Mount Kisco; Jerry M. Woodall, Bedford Hills, all of N.Y.

[73] Assignee: International Business Machines Corporation, Armonk, N.Y.

[21] Appl. No.: 419,381

[22] Filed: Sep. 17, 1982

[51] Int. Cl.[4] ............................................. H01L 29/56
[52] U.S. Cl. ........................................ 357/15; 357/22
[58] Field of Search ................................... 357/15, 22

[56] References Cited

U.S. PATENT DOCUMENTS

| | | | |
|---|---|---|---|
| 3,549,961 | 12/1970 | Gauit | 357/39 |
| 3,684,902 | 8/1972 | Giulliano et al. | 307/303 |
| 4,066,483 | 1/1978 | D'Altroy et al. | 148/187 |
| 4,132,996 | 1/1979 | Baliga | 357/21 |
| 4,236,166 | 11/1980 | Chou et al. | 357/15 |
| 4,466,008 | 8/1984 | Beneking | 357/15 |

OTHER PUBLICATIONS

*Fabrication and Numerical Simulation of the Permeable Base Transistor*, Bozler et al., IEEE Trans on Elec Devices, vol. 27, No. 6, Jun. 1980, pp. 1128-1141.
*High-Frequency High-Power Static Induction Transistor*, Nishizawa et al., IEEE Trans. on Elec. Devices, vol. 25, No. 3, Mar. 1978, pp. 314-322.
*Gate for MOS Devices: Rare Earth Silicides* Howard, IBM Tech Discl Bull., vol. 21, No. 7, Dec. 1978, pp. 2811-2813.
*Size Dependence of "Effective" Barrier Heights of Mixed-Phase Contacts* Freeouf et al, Amer. Vacuum Soc. 21(2) Jul./Aug. 1982, pp. 570-573.
"Physics of Semiconductor Devices", Second Edition, by S. M. Sze, published by John Wiley & Sons, pp. 77 and 78.

*Primary Examiner*—Martin H. Edlow
*Assistant Examiner*—Terri M. Henn
*Attorney, Agent, or Firm*—Alvin J. Riddles

[57] ABSTRACT

An electrical device which employs two-dimensional space charge modulation in a semiconductor structure. The device has an approximately Debye length wide contact and a rectifying contact positioned adjacent to each other within a Debye length on a semiconductor body and a contact remotely positioned. A bias on the rectifying contact will effect conduction between the other contacts.

10 Claims, 10 Drawing Figures

SPACE CHARGE MODULATION DEVICE

DESCRIPTION

1. Technical Field

The technical field of the invention is in devices that exhibit a controllably different electrical impedance in a circuit.

2. Background Art

There have been a number of semiconductor electrical switches in the art wherein a signal switches the output from one electrode to another. U.S. Pat. Nos. 3,549,961 and 3,684,902 are illustrations of such switching structures. Switching structures of this type heretofore in the art have operated with large signals and employed the principle of reverse biasing of a p-n junction in the semiconductor which has circuit performance limitations that result in slow operation.

DISCLOSURE OF THE INVENTION

In accordance with the invention a rectifying contact is placed within a Debye length of a second contact of the order of a Debye length in size on one surface of a semiconductor and a third contact is placed elsewhere on the same semiconductor body, the space charge in the semiconductor body under the rectifying contact under proper biasing can control the conductivity between the other two contacts.

The Debye length is a characteristic distance in semiconductors. It is defined and discussed in the text "Physics of Semiconductor Devices" by S. M. Sze, Second Edition, pages 77 and 78, published by Wiley, N.Y.

Figure 1:
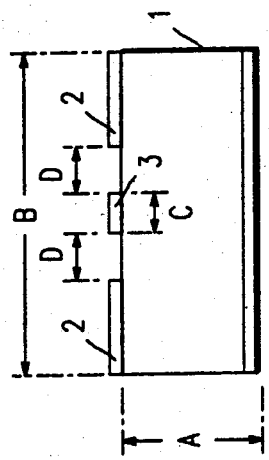
FIG. 1 is an illustration of the structure of the invention.

The principle of the invention may be seen in connection with FIG. 1 wherein on one surface of a semiconductor body 1 there is positioned a rectifying contact 2. The rectifying contact 2 surrounds or is parallel with a small width contact 3 positioned within a distance labelled dimension D from the rectifying contact 2. The dimension D is of the order of the extrinsic Debye length of the semiconductor 1. The contact 3 has a dimension C that is also of the order of a Debye length. A third contact 4 is positioned remote from the contacts 2 and 3. As an example, the remote positioning is illustrated in FIG. 1 by positioning a distance A on the opposite side of the semiconductor body 1.

In accordance with the invention, the essential elements are two contiguous semiconductor contacts, at least one rectifying, of an appropriate orientation, proximity and size on a sufficiently high resistivity semiconductor to permit a space charge beneath one contact to be modulated by the bias on the second contact.

A preferred embodiment as shown in FIG. 1 involves contact 2 as being rectifying and contacts 3 and 4 as being ohmic. The structure of FIG. 1 employs planar contact structures 2 and 3 where contact 3 is intrinsically ohmic and contact 2 is intrinsically rectifying. The gap D between the contacts and the lateral extent C of the intrinsically ohmic contact are of a size of the order of or less than the extrinsic Debye length of the underlying semiconductor substrate 1. The intrinsic conducting behavior of a contact may be defined as the two-terminal current voltage behavior of the contact when that contact is forming a two-terminal device with the substrate. In the structure of FIG. 1, the semiconductor 1 should be of sufficiently high resistivity to permit the space charge under the rectifying contact to penetrate a physical distance into the semiconductor under moderate voltage levels to affect carrier flow between other electrodes.

BEST MODE FOR CARRYING OUT THE INVENTION

The semiconductor 1 may be of silicon, doped to $10^{15}$ impurities per cubic centimeter. With this resistivity and dimensions maintained at C and D less than approximately 0.1 micrometers, the polarity of the signal on the contact 2 will affect current flow between contacts 1 and 3.

The device of FIG. 1 is preferably fabricated by using Schottky barrier contacts with heights of different levels so that ohmic or rectifying behavior is produced. Where the semiconductor 1 is silicon doped to about $10^{15} cm^3$ with conductivity type n, ohmic contacts 3 and 4 may be obtained using a low barrier Schottky contact where that barrier height is about 0.2–0.3 eV. Such contacts can be obtained through the use of rare earth silicides as set forth in IBM Technical Disclosure Bulletin, Vol. 21, p. 2811, 1978. The rectifying contact 2 can be formed using a higher barrier Schottky contact. For a rectifying contact, the barrier height should be of the order of 0.8 eV, such as is obtainable with Au or PtSi on a silicon semiconductor.

Figure 3:
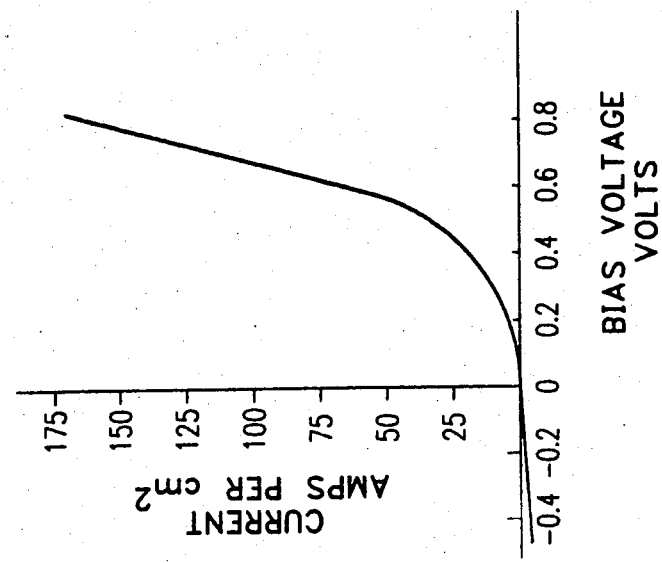
FIG. 3 is a current voltage characteristic of the invention and the circuit conditions of FIG. 2.
Figure 2:
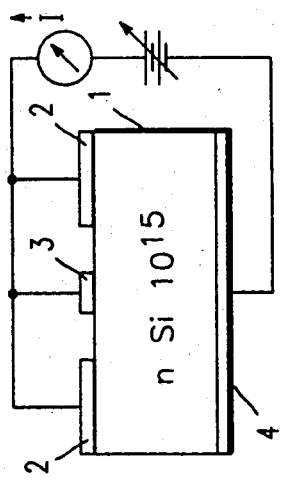
FIG. 2 is a circuit configuration employing the invention.
Figure 5:
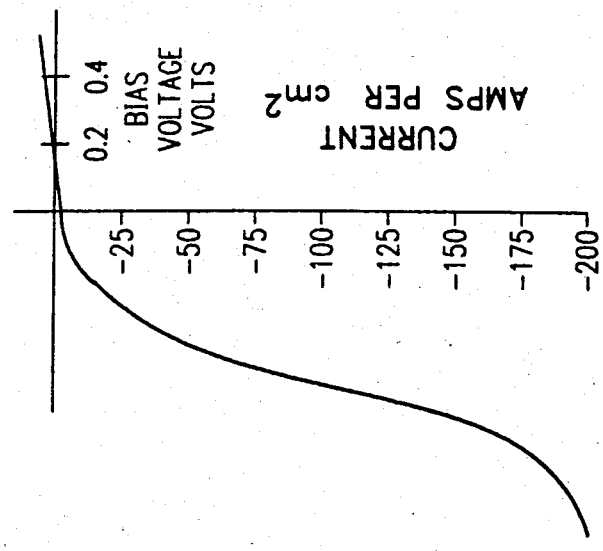
FIG. 5 is a current voltage characteristic of the invention connected in FIG. 4.
Figure 4:
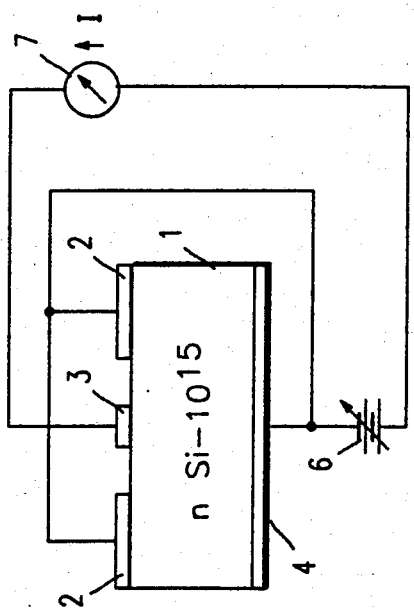
FIG. 4 is a circuit illustration exhibiting another characteristic of the invention.

An illustration of the operation of the device may be seen in connection with FIGS. 2 through 5 wherein FIGS. 2 and 3 illustrate a circuit and corresponding performance in one polarity and FIGS. 4 and 5 illustrate a circuit and corresponding performance in an opposite polarity. Referring to FIG. 2 using battery 6 as a source of power, and a meter 7 current indicator the semiconductor 1 has one ohmic contact 4 connected to the battery 6 of about 1.5 volts and ohmic contacts 3 and rectifying contact 2 are connected through the current indicator 7 to the other side of the battery.

Under these conditions a space charge under the high barrier or rectifying contact 2 will penetrate the high resistivity body 1 far enough to affect the conductivity through the body 1 between the low barrier or ohmic contacts 3 and 4.

In the body 1 of the device, for a voltage equal to zero, the depletion depth in $10^{15}$ per cc n-type silicon radiating from contact 2 would deplete the area below contact 3 when positioned lateral to contact 2 for the intergap D of about 500 Å and contact size C of 0.15 micrometers. These dimensions result in the distance from the edge of the contact 2 to the center of contact 3 being of the order of a Debye length in semiconductor material of this resistivity. This would not permit any significant current flow between contacts 3 and 4.

Where the voltage is selected to be greater than zero, the depletion depth radiating from contact 2 would decrease thus allowing a clear conducting path of electrons between contacts 3 and 4. By appropriate choice of size for contact 3 and for the gap between contacts 2 and 3, that portion of the current through contact 3 dominates the flow for voltages of the order of 0.6 V. Hence, a high impedance is maintained at contact 2 and a low impedance between contacts 3 and 4. Where the impressed voltage from battery 6 is less than zero, the depletion width will radiate even more below contact 2 than for the V=0 case and the current flow between contacts 3 and 4 will be very small.

Referring next to FIG. 3, the current voltage (I-V) characteristic curve for the circuit of FIG. 2 is described. It will be apparent to one skilled in the art that the similarity of the curve of FIG. 3 to that of an ordinary I-V curve for a diode. Since the silicon of the body 1 is doped n-type in this example, the I-V characteristic of contact 3 is qualitatively that of a normal Schottky diode as shown in FIG. 3.

In accordance with the invention, it is also possible to provide an opposite or reverse diode characteristic. This is illustrated in connection with the circuit of FIG. 4 and the current voltage (IV) output characteristic of FIG. 5. In FIG. 4 the circuit configuration is such that the rectifying contacts or contact segments 2 and the ohmic contact 4 are shorted together and the ohmic contact 3 is held at a positive potential with the battery 6. The (IV) characteristic of FIG. 5 is achieved by varying the battery 6 and observing the current flow through the current indicator 7.

Under these conditions, for V=0, the depletion depth below contacts 2 and 3 remains as configured for the forward diode. However, for the condition V<0, the electron accumulation situated directly below contact 3 as a result of the standard ohmic n+ doping pocket or below the low barrier height of contact 3 is pushed farther into the semiconductor, effectively parting the depletion layers radiating from contact segment 2. This provides a clear path for electron flow between contacts 3 and 4.

For the condition where V>0, the electron accumulation present below contact 3 is pulled closer to contact 3 than the previously described V=0 case and no significant path of electron conduction between contacts 3 and 4 would exist.

The I-V characteristic corresponding to the configuration is shown in FIG. 5. The characteristic polarity is clearly reversed and is in marked contrast to that of FIG. 3. The impedance of contact 2 also remains high in this reversed diode case.

In essence, the three-terminal device of the invention implements a reversing diode concept in that the polarity of conduction between the two contacts 3 and 4 is determined by the potential that is present on a high impedance contact 2.

Two representative illustrative circuits, FIGS. 2 and 4, have been provided to permit one skilled in the art to readily implement the requirement. The essential features of the invention have been described and are based upon two-dimensional space charge modulation present beneath a contact on a semiconductor in Debye length proximate relationship to a rectifying contact.

The structure of the invention is susceptible of application by one skilled in the art to many circuits and structures in addition to the applications using the standard rectifying characteristics shown in FIGS. 3 and 5.

Specifically, the change in current between two contacts at a well-defined potential due to a change in potential at a separate third contact implies a transistor-like action.

As an illustration, the following application of the principles of the invention involves the performance equivalent of a device known as a Permeable Base Transistor described in the IEEE Transactions on Electron Devices, Vol. ED-25, No. 3, March 1978 and IEEE Transactions on Electron Devices, Vol. ED-27, No. 6, June 1980.

The Permeable Base Transistor has a small grating having a period of 400-3200 Angstroms, and a thickness of 50-300 Angstroms imbedded in single crystal GaAs. This device has very favorable performance in speed and power consumption but the extremely small device dimensions and the imbedding process have made manufacture difficult.

Figure 6:
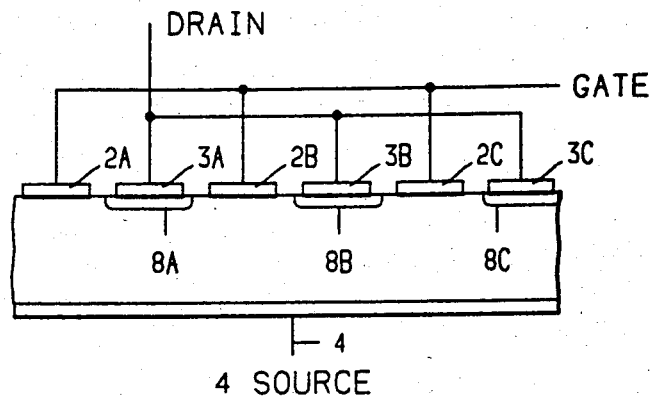
FIG. 6 is an illustration of a plurality of elements of the invention on a single substrate.

Employing the principles of the invention, the structure of FIG. 6 will provide an equivalent performance to the Permeable Base Transistor with a much simpler construction. The structure of FIG. 6 has an ohmic contact 4 on one surface as in previous structures, performing the function of the source electrode in the permeable base transistor. A series of low impedance Schottky barrier electrodes or ohmic contacts 3A, 3B, 3C, etc., serve the function of the drain electrode of the permeable base transistor. A series of higher impedance Schottky rectifying contacts, labelled 2A, 2B, 2C, etc., serve the function of the gate electrode of the permeable base transistor. The distance between the contacts 2A-2C, etc. and 3A-3C, etc. is of the order of a Debye length as is the width dimension of the contacts 3A-3C, etc. The body 1 is of n-conductivity type GaAs doped to around $10^{15}$.

Thus the structure of FIG. 6 employs surface Schottky barrier gate electrodes 2A-2C, etc. rather than a buried grid and takes advantage of the fact that for small enough device structures, where the electron spacing is of the order of a Debye length, the performance is comparable with Permeable Base Transistor performance.

In accordance with the invention, the two-dimensional depletion layer spreading from the gate electrodes can give controlled device operation for such surface electrodes. Doping pockets of n+ labelled 8A, 8B, 8C, etc., under each of the low barrier Schottky or ohmic contacts 3A, 3B, 3C, etc., are provided to prevent the phenomenon of punch-thru between the gate electrodes 2A-2C, etc., and drain 3A-3C, etc., electrodes.

In order to achieve the structure of FIG. 6, the steps illustrated in FIGS. 7 through 10 may be employed as an illustrative process.

The process of FIGS. 7 to 10 will produce a structure with an interdigitated series of contacts.

Figure 7:
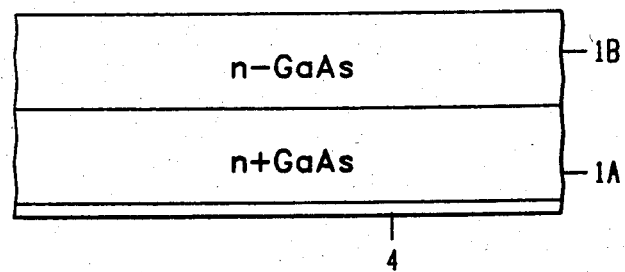
FIGS. 7 through 10 are illustrations of process steps in the fabrication of the device shown in FIG. 6.

In FIG. 7, a GaAs substrate 1 is provided with an ohmic layer 4 on one surface, a higher n+ conductivity region 1A is provided adjacent to what will be the source contact 4, and is employed to decrease parasitic source resistance. A higher resistivity n GaAs region labelled 1B is to serve as the active region of the device.

Figure 8:
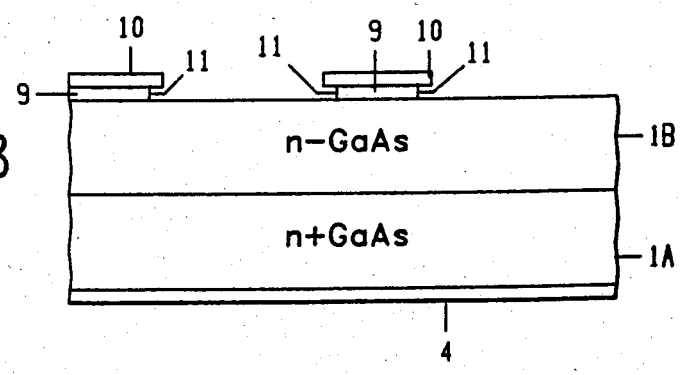

Referring next to FIG. 8, a double layer of metallization is shown as first layer 9 adjacent to the surface of the high resistivity semiconductor region 1A and a second layer 10 above layer 9. The metallizations 9 and 10 are such that they perform differently with respect to an eroding operation so that the top layer 10 can be patterned and then used as a mask to pattern an undercut 11 on the lower metal layer 9. When metals such as platinum for the second layer 10 and tungsten for the first layer 9 are employed and the technique of plasma etching well known in the art is utilized, the structure of FIG. 8 is readily achieved. The electrode spacings in the patterning are of the 300 Å order. The undercut 11 will permit vertical deposition in a later step without shorting.

Figure 9:
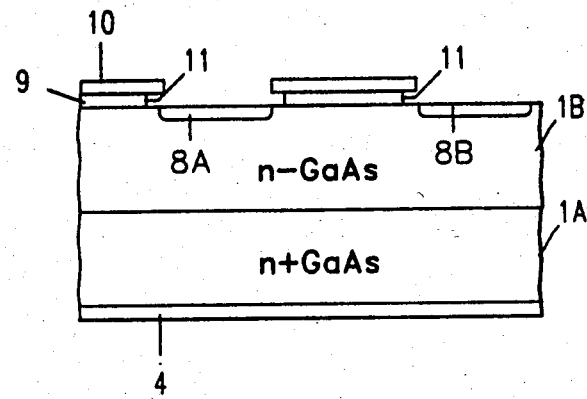

Referring next to FIG. 9, the electrode structure involving the metal layers 10 with the undercut layer 9 of FIG. 8 is employed in a standard ion implantation of n conductivity type impurities which operates to form the n+ pockets 8A and 8B described in connection with FIG. 6 close to the undercut 11. Since an implanting operation will require annealing that operation is done at this point.

Since the first layer electrode metal 9 is in contact with the GaAs 1 during an annealing step, it will be apparent to one skilled in the art that the metal selected for first layer 9, if annealing and implantation are to be used, must be a metal like tungsten or an alloy of titanium and tungsten that can withstand a proximity anneal.

Other techniques such as diffusion for forming the n+ regions 8A and 8B would be acceptable.

Figure 10:
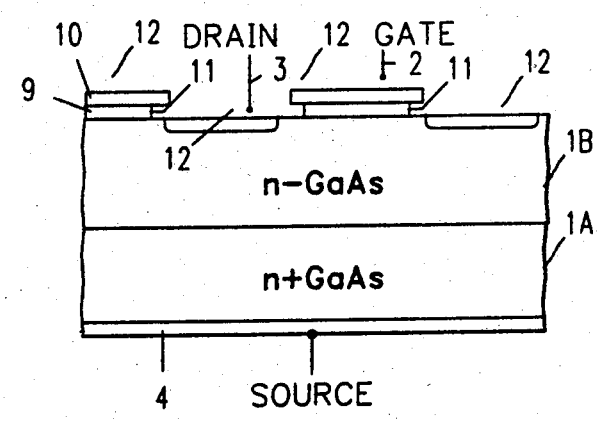

Referring next to FIG. 10, the vertically differentiated or two-level 9-10 gate electrodes 2 are used as shadow masks to define the drain electrodes 3. This is accomplished by a vertical deposition of a metal such as aluminum 12 which is confined by the overhang 11.

Large contacts to the gate 2 and drain 3 electrodes of FIG. 10 are formed at the edge of the device in standard large scale integrated circuit practice, but are not shown.

What has been described is the principle of a three-terminal device wherein space charge modulation under a contact with size of the order of a Debye length positioned within a Debye length of a rectifying contact on a semiconductor can modulate current flow between the small ohmic contact and a remote larger ohmic contact and the principle has been shown extended into the more sophisticated permeable base transistor device including a process for producing the structure.

Having thus described our invention, what we claim as new and desire to secure by Letters Patent is:

1. A semiconductor structure comprising in combination:
   a single band gap semiconductor material body having at least a first surface,
   a first contact on said first surface of said body, said first contact having at least one dimension of the order of the Debye length in said semiconductor,
   a second essentially rectifying contact on said first surface positioned within said Debye length of said first contact, and
   a third contact to said semiconductor body positioned remote from said first and second contacts.

2. The semiconductor structure of claim 1 wherein said first and third contacts are ohmic.

3. The structure of claim 2 wherein said body has first and second essentially parallel surfaces, said first and second contacts being positioned on said first surface and said third contact being positioned on said second surface.

4. The structure of claim 3 wherein said first contact is a low barrier and said second rectifying contact is a Schottky barrier with a higher barrier.

5. The structure of claim 4 wherein said semiconductor body is n-type silicon doped to $10^{15}$ impurities per cubic centimeter, said first contact is a 0.2 to 0.3 V barrier, and a size of the order of 0.1 micrometer, said second rectifying contact is a Schottky barrier with an of the order of 0.8 V barrier and the distance from said first contact to said second rectifying contact being of the order of 500 Å.

6. In a semiconductor switching device of the type wherein a signal on a first electrode controls the impedance between a second and a third electrode, the improvement comprising:
   the providing of a single band gap semiconductor material substrate and both a first contact and a second rectifying type contact, at least one of said first and second contacts being of a size comparable to the Debye length of said semiconductor and said first and second contacts positioned within said Debye length of said semiconductor on the same surface of said semiconductor substrate and a third contact remotely positioned on said substrate.

7. The structure of claim 6 wherein said substrate has two essentially parallel surfaces and said first and said second rectifying type contacts are in proximate relationship on one surface and said third contact covers the area of the second surface.

8. An improved permeable base type transistor comprising a single band gap semiconductor material substrate having at least first and second essentially parallel surfaces, a broad area first contact covering a first surface, a second contact and a third rectifying-type contact, said second contact having at least one dimension of the order of the Debye length for said semiconductor and the separation between said second contact and said third rectifying-type contact being of the order of said Debye length.

9. The transistor of claim 8 wherein said first and second contacts are ohmic.

10. The transistor of claim 9 wherein said second and said third contacts are each a series of contacts, each said contact series being positioned in interdigitated relationship on one surface of said semiconductor substrate and each member of the series of said first contact having a high conductivity region in said semiconductor adjacent to said contact.

* * * * *